(12) United States Patent
Harari et al.

(10) Patent No.: US 10,896,916 B2
(45) Date of Patent: Jan. 19, 2021

(54) REVERSE MEMORY CELL

(71) Applicant: SUNRISE MEMORY CORPORATION, Los Gatos, CA (US)

(72) Inventors: Eli Harari, Saratoga, CA (US); George Samachisa, Atherton, CA (US); Yupin Fong, Fremont, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/194,225

(22) Filed: Nov. 16, 2018

(65) Prior Publication Data

US 2019/0157296 A1    May 23, 2019

Related U.S. Application Data

(60) Provisional application No. 62/588,097, filed on Nov. 17, 2017.

(51) Int. Cl.

| | | |
|---|---|---|
| *H01L 27/11582* | (2017.01) | |
| *H01L 29/49* | (2006.01) | |
| *H01L 29/423* | (2006.01) | |

(52) U.S. Cl.
CPC .. *H01L 27/11582* (2013.01); *H01L 29/42384* (2013.01); *H01L 29/4908* (2013.01); *H01L 29/4925* (2013.01)

(58) Field of Classification Search
CPC ........... H01L 27/11582; H01L 29/4908; H01L 29/4925; H01L 29/42384; H01L 27/11578; H01L 27/11568; H01L 27/2481; H01L 27/101; G11C 11/22; G11C 13/0069; G11C 13/0007; G11C 13/0004; G11C 13/003; G11C 16/10; G11C 13/0011

See application file for complete search history.

(56) References Cited

U.S. PATENT DOCUMENTS

| | | |
|---|---|---|
| 3,851,317 A | 11/1974 | Kenyon |
| 4,760,556 A | 7/1988 | Deguchi et al. |

(Continued)

FOREIGN PATENT DOCUMENTS

WO    2018236937 A1    12/2018

OTHER PUBLICATIONS

PCT Search Report and Written Opinion, PCT/US2018/038373, dated Sep. 10, 2018.

(Continued)

*Primary Examiner* — Selim U Ahmed
(74) *Attorney, Agent, or Firm* — Edward C. Kwok; VLP Law Group, LLP

(57) ABSTRACT

A non-volatile "reverse memory cell" suitable for use as a building block for a 3-dimensional memory array includes a charge-trapping layer which is programmed or charged through gate-injection, rather than channel-injection. Such a reverse cell may be implemented as either an n-channel memory cell or a p-channel memory cell, without incurring design or process penalties, or any complexity in programming or erase operations. Furthermore, all reading, programming, erase, program-inhibiting operations may be carried out in the reverse memory cell using only positive or only negative voltages, thereby simplifying both the design and the power management operations.

18 Claims, 4 Drawing Sheets

(56) References Cited

U.S. PATENT DOCUMENTS

| | | | |
|---|---|---|---|
| 5,583,808 | A | 12/1996 | Brahmbhatt |
| 5,646,886 | A | 7/1997 | Brahmbhatt |
| 5,768,192 | A | 6/1998 | Eitan |
| 6,040,605 | A * | 3/2000 | Sano .................. G11C 11/5635 257/314 |
| 6,130,838 | A | 10/2000 | Kim et al. |
| 6,434,053 | B1 | 8/2002 | Fujiwara |
| 6,580,124 | B1 | 6/2003 | Cleeves et al. |
| 6,744,094 | B2 | 6/2004 | Forbes |
| 6,946,703 | B2 | 9/2005 | Ryu et al. |
| 7,005,350 | B2 | 2/2006 | Walker et al. |
| 7,233,522 | B2 | 6/2007 | Chen et al. |
| 7,612,411 | B2 | 11/2009 | Walker et al. |
| 8,026,521 | B1 | 9/2011 | Or-Bach et al. |
| 8,630,114 | B2 | 1/2014 | Lue |
| 8,878,278 | B2 | 11/2014 | Alsmeier et al. |
| 9,842,651 | B2 | 12/2017 | Harari |
| 9,892,800 | B2 | 2/2018 | Harari |
| 9,911,497 | B1 | 3/2018 | Harari |
| 10,074,667 | B1 | 9/2018 | Higashi |
| 10,096,364 | B2 | 10/2018 | Harari |
| 10,121,553 | B2 | 11/2018 | Harari |
| 10,249,370 | B2 | 4/2019 | Harari |
| 10,254,968 | B1 | 4/2019 | Gazit et al. |
| 10,381,378 | B1 | 8/2019 | Harari |
| 10,395,737 | B2 | 8/2019 | Harari |
| 10,431,596 | B2 | 10/2019 | Herner et al. |
| 10,475,812 | B2 | 11/2019 | Harari |
| 10,622,377 | B2 | 4/2020 | Harari et al. |
| 2001/0030340 | A1 | 10/2001 | Fujiwara |
| 2001/0053092 | A1 | 12/2001 | Kosaka |
| 2002/0051378 | A1 | 5/2002 | Ohsawa |
| 2002/0193484 | A1 | 12/2002 | Albee |
| 2004/0246807 | A1 | 12/2004 | Lee |
| 2005/0128815 | A1 | 6/2005 | Ishikawa |
| 2006/0155921 | A1 | 7/2006 | Gorobets et al. |
| 2007/0230234 | A1 | 10/2007 | Ohsawa |
| 2008/0239812 | A1 | 10/2008 | Abiko |
| 2009/0157946 | A1 | 6/2009 | Arya |
| 2009/0237996 | A1 | 9/2009 | Kirsch et al. |
| 2009/0279360 | A1 | 11/2009 | Lee |
| 2009/0316487 | A1 | 12/2009 | Lee et al. |
| 2010/0124116 | A1 * | 5/2010 | Maeda .................. G11C 5/02 365/185.11 |
| 2011/0208905 | A1 | 8/2011 | Shaeffer et al. |
| 2011/0298013 | A1 | 12/2011 | Hwang |
| 2012/0182801 | A1 | 7/2012 | Lue |
| 2012/0243314 | A1 | 9/2012 | Maeda |
| 2013/0007740 | A1 | 3/2013 | Kato et al. |
| 2013/0256780 | A1 * | 10/2013 | Kai .................. H01L 29/40117 257/324 |
| 2014/0117366 | A1 * | 5/2014 | Saitoh .................. H01L 27/088 257/64 |
| 2014/0151774 | A1 | 6/2014 | Rhie |
| 2014/0328128 | A1 | 11/2014 | Louie et al. |
| 2014/0340952 | A1 | 11/2014 | Ramaswamy et al. |
| 2015/0131381 | A1 | 5/2015 | Rhie |
| 2015/0194440 | A1 | 7/2015 | Noh et al. |
| 2016/0086970 | A1 | 3/2016 | Peng |
| 2016/0314042 | A1 | 10/2016 | Plants |
| 2017/0092370 | A1 | 3/2017 | Harari |
| 2017/0148810 | A1 | 5/2017 | Kai et al. |
| 2017/0358594 | A1 | 12/2017 | Lu et al. |
| 2018/0108416 | A1 | 4/2018 | Harari |
| 2018/0269229 | A1 | 9/2018 | Or-Bach et al. |
| 2018/0366471 | A1 | 12/2018 | Harari et al. |
| 2018/0366489 | A1 | 12/2018 | Harari et al. |
| 2019/0006009 | A1 | 1/2019 | Harari |
| 2019/0180821 | A1 | 6/2019 | Harari |
| 2019/0206890 | A1 | 7/2019 | Harari et al. |
| 2019/0244971 | A1 | 8/2019 | Harari |
| 2019/0325964 | A1 | 10/2019 | Harari |
| 2019/0319044 | A1 | 11/2019 | Harari |
| 2019/0355747 | A1 | 11/2019 | Herner et al. |
| 2019/0370117 | A1 | 12/2019 | Fruchtman et al. |
| 2020/0051990 | A1 | 2/2020 | Harari et al. |
| 2020/0098779 | A1 | 3/2020 | Cernea et al. |
| 2020/0176468 | A1 | 6/2020 | Herner et al. |

OTHER PUBLICATIONS

"Partial European Search Report EP 16869049.3", dated Jul. 11, 2019, pp. 1-12.

"Multi-layered Vertical gate NAND Flash Overcoming Stacking Limit for Terabit Density Storage" by W. Kim et al., published in the 2009 Symposium on VLSI Tech. Dig. of Technical Papers, pp. 188-189.

"A Highly Scalable 8-Layer 3D Vertical-gate (VG) TFT NAND Flash Using Junction-Free Buried Channel BE-SONOS Device," by H.T. Lue et al., published in the 2010 Symposium on VLSI: Tech. Dig. of Technical Papers, pp. 131-132.

"High-Endurance Ultra-Thin Tunnel Oxide in Monos Device Structure for Dynamic Memory Application", by H.C. Wann and C.Hu, published in IEEE Electron Device letters, vol. 16, No. 11, Nov. 1995, pp. 491-493.

International Search Report and Written Opinion, PCT/US2016/060457, dated Apr. 13, 2017.

"EP Extended Search Report EP168690149.3", dated Oct. 18, 2019.

* cited by examiner

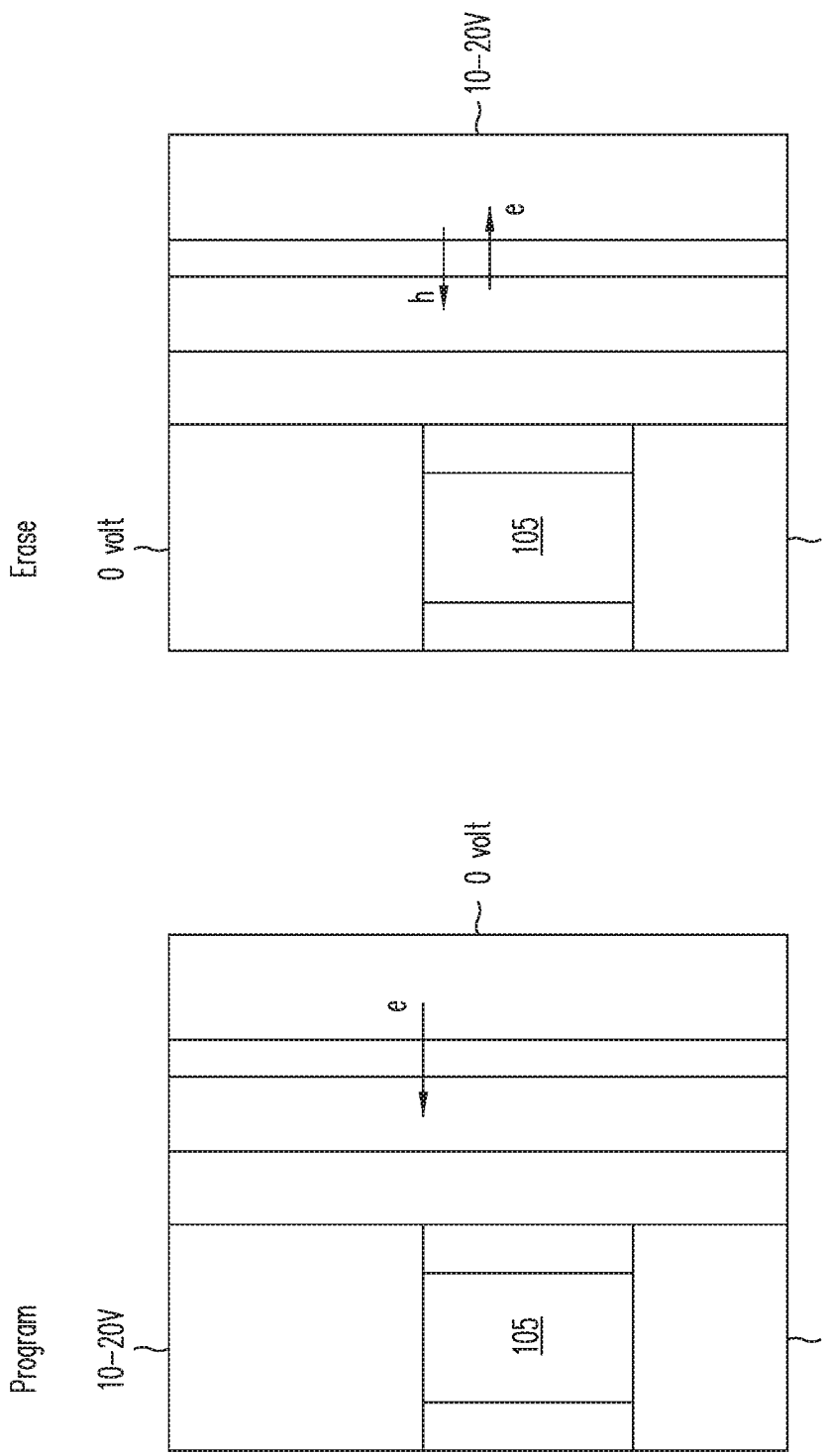

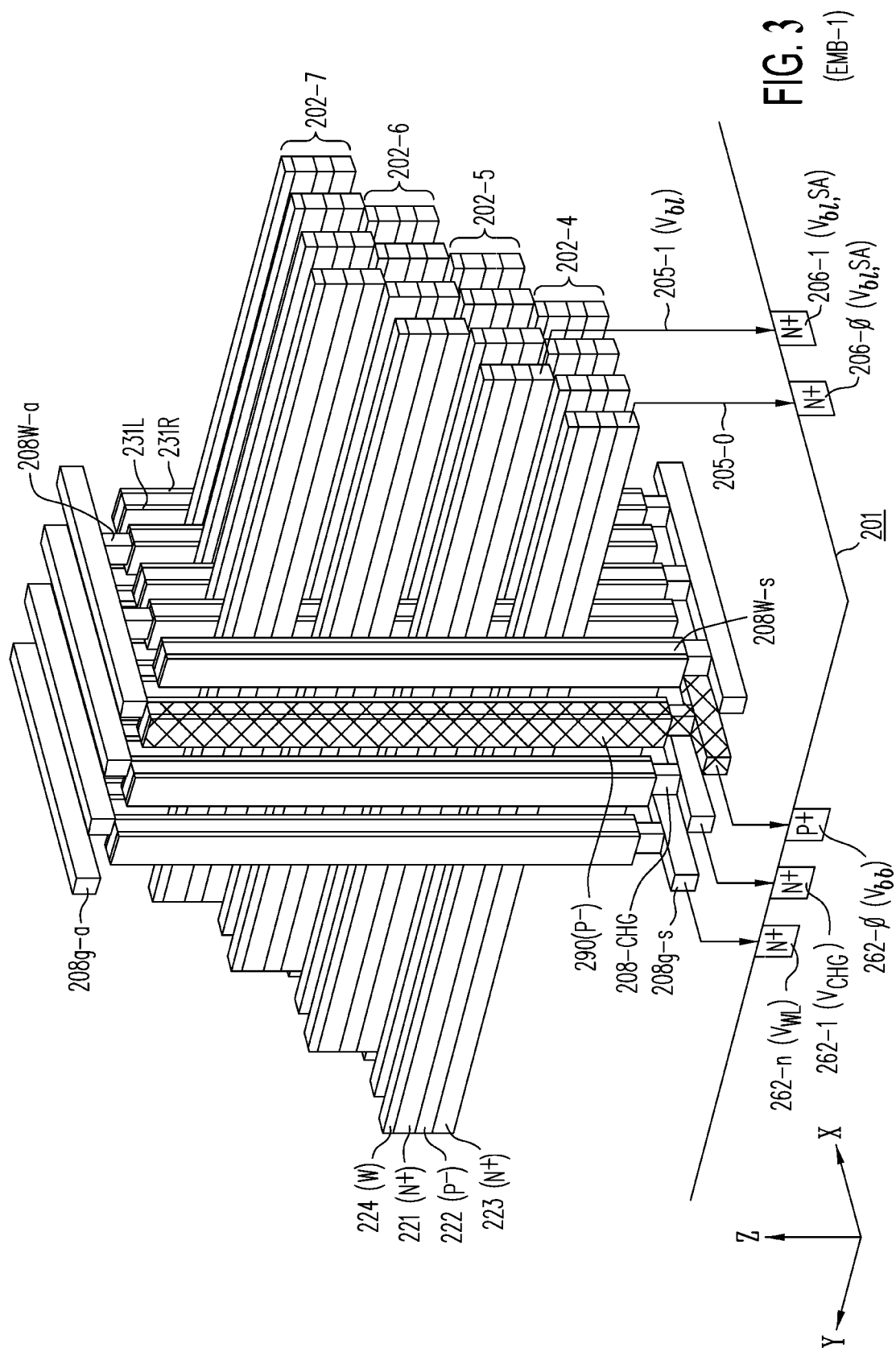

REVERSE MEMORY CELL

CROSS-REFERENCE TO RELATED APPLICATIONS

The present application relates to and claims priority of U.S. provisional patent application ("Provisional Application"), Ser. No. 62/588,097, entitled "REVERSE MEMORY CELL," filed on Nov. 17, 2017. The present application relates also to U.S. patent application ("Non-provisional Patent Application"), Ser. No. 15/248,420, entitled "Capacitive-coupled Non-Volatile Thin-film Transistor Strings in Three-Dimensional Arrays," filed on Aug. 29, 2016. The disclosures of the Provisional Application and the Non-provisional Patent Application are hereby incorporated by reference in their entireties.

BACKGROUND OF THE INVENTION

1. Field of the Invention

The present invention relates to memory devices. In particular, the present invention relates to a memory device with a gate-injected charge storage layer.

2. Discussion of the Related Art

Memory devices with a gate-injected charge-storage layer have been disclosed, for example, in the article entitled "A Novel Gate Injection Program/Erase P-channel NAND type Flash Memory with High (10M cycle) Endurance" ("Lue"), by Hang-Ting Lue et al., and published in the 2007 Symposium on VLSI Technology Digest of Technical Papers, pp. 140-141. Lue discloses a p-channel memory cell. Lue is constrained to a p-channel memory cell to take advantage of a self-boosting technique in a program-inhibit method that requires a reversed polarity in the drain-body junction to avoid program disturb. Lue's device is complex with respect to processing, design and programming and erasing operations. Being constrained to use a p-channel memory cell is also very limiting. For example, a p-channel memory cell has a lower cell current, due to the low mobility inherent in hole conduction, as compared to the high mobility inherent in the electron conduction in an n-channel cell. The channel, drain and source electrodes of Lue's memory cell are also formed in a silicon substrate. Thus, Lue's memory cell cannot be used as a building block of a 3-dimensional memory array.

For programming and erase operations, Lue's memory cell requires both positive and negative voltages. Specifically, Lue's memory cell requires a negative voltage (e.g., -19 volts) for programming operations and a positive voltage (e.g., 19 volts) for erase operations. Requiring both positive and negative polarities with relatively high magnitudes (e.g., 19 volts) increases design and process complexities (e.g., requiring a triple-well process and array decoding circuits). These requirements impose a significantly higher memory cost relative to conventional non-volatile channel-injected charge memory cells.

SUMMARY

According to one embodiment of the present invention, a thin-film memory cell includes (a) first and second deposited semiconductor layers of a first conductivity type; (b) a third deposited semiconductor layer of a second conductivity type provided between the first and second deposited semiconductor layers; (c) a first dielectric layer adjacent the third deposited semiconductor layer; (d) a charge-trapping layer adjacent the first dielectric layer, the first dielectric layer separating the charge-trapping layer from the third deposited semiconductor layer; (e) a second dielectric layer adjacent the charge-trapping layer and spaced apart from the first dielectric layer by the charge-trapping layer; and (f) a conductive layer adjacent the second dielectric layer and spaced apart from the charge-trapping layer by the second dielectric layer, wherein the first and second dielectric layers have a different in layer thickness such that, when a sufficiently large potential difference is imposed between the conductive layer and the third deposited semiconductor layer, electric charge is exchanged between the conductive layer and the charge-trapping layer by tunneling through the second dielectric layer.

In various embodiments of the present invention, the conductive layer of the thin-film memory cell may be formed out of $P^+$-type or $N^+$-type polysilicon. In some embodiments, the first and second deposited semiconductor layers may each be $P^+$-type polysilicon, while the third deposited semiconductor layer may be $N^-$-type polysilicon. In other embodiments, the first and second deposited semiconductor layers may each be $N^+$-type polysilicon, while the third deposited semiconductor layer may be $P^-$-type polysilicon. The charge-trapping layer may include silicon nitride, while the first and second dielectric layers each include silicon oxide.

In a thin-film memory cell of the present invention, the first, second and third deposited semiconductor layers serve, respectively, as a source electrode, a drain electrode and a channel region for the thin-film memory cell, the conductive layer serves as a gate electrode for the thin-film memory cell, and the charge-trapping layer serves as storage layer for the thin-film memory cell.

According to one embodiment of the present invention, the thin-film memory cell may be used as a building block for a three-dimensional memory array. In one exemplary configuration, a number of thin-film memory cells are formed in a deposited semiconductor structure ("an active strip") extending along a direction parallel to a planar surface of a semiconductor substrate. A number of such active strips may be stacked one on top of another—isolated from each other by dielectric layers—along a direction perpendicular to the semiconductor substrate. In one such embodiment, a number of conductive columns are provided extending along the direction perpendicular to the semiconductor substrate, each being placed adjacent the active strips, such that each conductive column serves as a common gate electrode to a memory cell in each of the adjacent active strips.

According to one embodiment of the present invention, a thin-film memory cell may be programmed, erased, read, program-inhibited and erase-inhibited by applying predetermined voltages of the same polarity relative to a ground reference voltage to the source electrode, the drain electrode, and the gate electrode.

The present invention is better understood upon consideration of the detailed description below in conjunction with the accompanying drawings.

BRIEF DESCRIPTION OF THE DRAWINGS

FIGS. 2(b) and 2(c) show the voltage biases on the common source, the common drain and the gate electrodes of memory cell 201 of FIG. 2(a) during programming and erase operations, respectively.

FIG. 3 is reproduced from FIG. 2i-1 of the Non-provisional Patent Application, incorporated by reference above, showing a three-dimensional view of horizontal active layers 202-4 to 202-7, with local word lines 208W-s or local pre-charge word lines 208-CHG connected to global word lines 208 g-s and local word lines 208W-a connected to global word lines 208 g-a, and showing each active layer as having its N+ layer 223 (acting as a drain region) connected through select circuits to any of voltage supplies (e.g., $V_{ss}$, $V_{bl}$, $V_{pgm}$, $V_{inhibit}$, and $V_{erase}$), decoding, sensing and other circuits arranged either adjacent or directly underneath the memory arrays. The substrate circuitry is represented schematically by 206-0 and 206-1 in substrate 201.

DETAILED DESCRIPTION OF THE PREFERRED EMBODIMENTS

The present invention provides a non-volatile "reverse memory cell" for a 3-dimensional memory array. In this detailed description, the term "reverse memory cell" refers to a memory cell that includes a charge-trapping layer which is programmed or charged through gate-injection, rather than channel-injection. A reverse memory cell of the present invention may be implemented as either an n-channel memory cell or a p-channel memory cell, without incurring design or process penalties, or any complexity in programming or erase operations. Furthermore, all reading, programming, erase, program-inhibiting operations may be carried out in the reverse memory cell of the present invention using only one polarity of voltages: i.e., only positive voltages for an N-channel reverse memory cell and only negative voltages for P-channel reverse memory cell, thereby simplifying both the design and the power management operations.

Figures 1A, 2A:
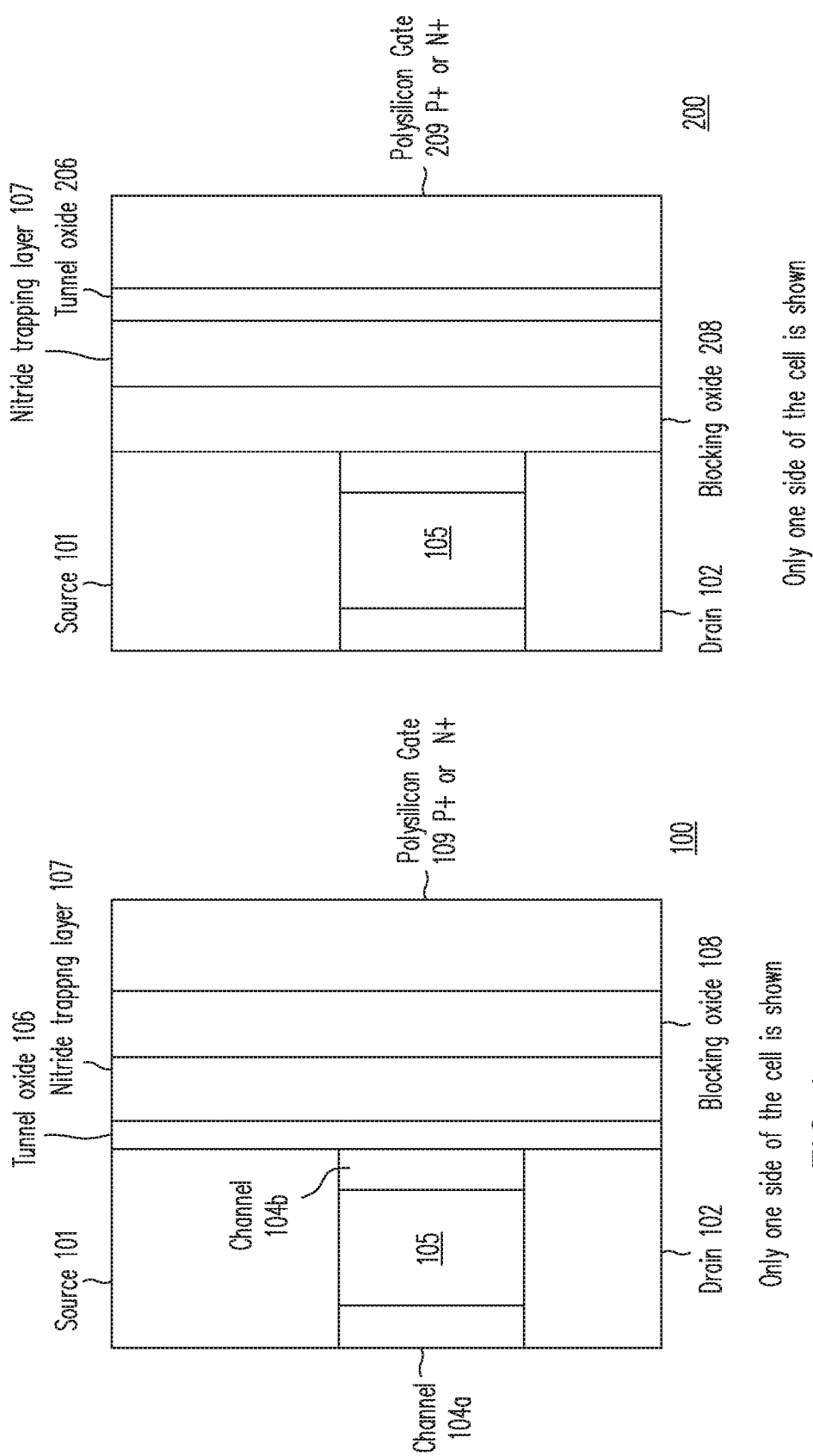
FIG. 1(a) illustrates a cross section through a memory cell in a memory structure that includes memory transistor $T_L(583)$ of FIG. 5h-3 in the Non-provisional Patent Application.
FIG. 2(a) shows a cross section through memory transistor 201 in active strip 200, in accordance with one embodiment of the present invention.

The Non-provisional Patent Application, incorporated by reference above, discloses structures, including memory cells, for forming 3-dimensional memory arrays and methods for fabricating such structures. For example, one of such structures is illustrated in FIGS. 5h-1 to 5h-3 of the Non-provisional Patent Application. FIG. 1(a) is a cross section through a memory cell in memory structure ("active strip") 100 that includes memory cell $T_L(583)$ of FIG. 5h-3 in the Non-provisional Patent Application. As shown in FIG. 1(a), active strip 100 extends along both directions perpendicular to the plane of the cross section. Active strip 100 includes (a) first and second semiconductor layers 101 and 102, (b) third semiconductor layer 104, including strips 104a and 104b, (c) isolation layer 105 between strips 104a and 104b, (d) tunnel oxide layer 106, (e) nitride trapping layer 107, (e) blocking layer 108 and (f) conductor column 109, which is one of numerous vertical columns each of a predetermined extent spaced apart along the perpendicular directions. First, second and third semiconductor layers 101, 102 and 103 may be deposited polysilicon layers. Therefore, these layers form thin-film memory cells, such as memory cell $T_L(583)$, along active strip 100. Detailed descriptions and discussions of suitable fabrication processes for the memory structure of FIG. 1(a) are provided in the Non-provisional Patent Application.

As shown in FIG. 1(a), first and second semiconductor layers 101 and 102 serve as (i) a common source region or electrode, and (ii) a common drain or bit line region or electrode, respectively, for all memory cells along active strip 100. Strips 104a and 104b, also extending along both directions perpendicular to the cross section of FIG. 1(a), serve as channel regions for memory cells on the respective sides of active strip 100. Nitride trapping layer 107, provided between tunnel oxide layer 106 and blocking layer 108, serves as a charge-trapping storage layer for the memory cells. Conductor column 109 provides a gate (or "word line") region or electrode to a memory cell in active strip 100. Strips 104a and 104b are typically lightly doped (e.g., p⁻), while first and second semiconductor layers are heavily doped at an opposite conductivity (e.g., N⁺). Conductor column 109 may be formed, for example, by polysilicon (e.g., N⁺-doped or P⁺-doped). Each memory cell is formed at the overlapping structure between conductor column 109 and strip 104b. For illustration purpose only, FIG. 1(a) shows only one lateral side of active strip 100; those skilled in the art would understand from the Non-provisional Patent Application that, in mirror-image order to the left of strip 104a, may be provided (but not shown) corresponding tunnel, nitride trapping and blocking layers and a corresponding set of vertical polysilicon columns.

Figure 1C:
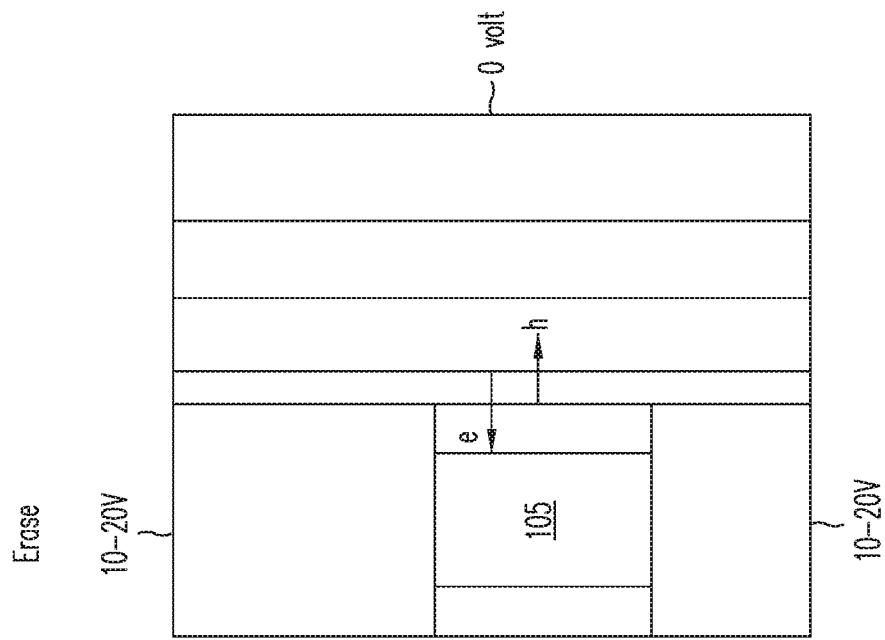
FIGS. 1(b) and 1(c) show the voltage biases on the source, drain and gate electrodes for the memory cell of FIG. 1(a) during programming and erase operations, respectively.
Figure 1B:
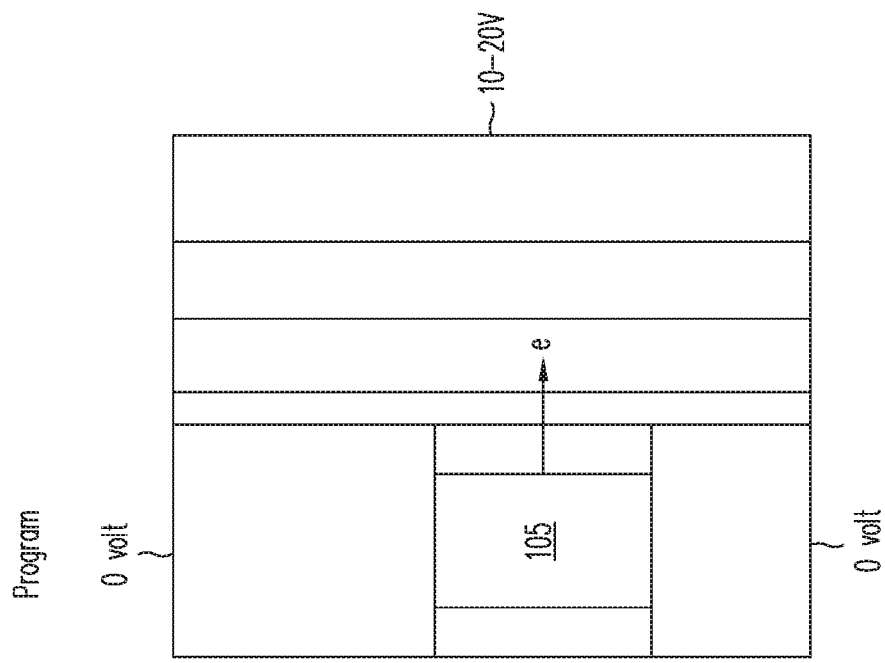

FIGS. 1(b) and 1(c) show the voltage biases on the common source, common drain and gate electrodes of the memory cell of FIG. 1(a) during programming and erase operations. As shown in FIG. 1(b), when programming, the common source and drain electrodes of the memory cell (i.e., first and second semiconductor layers 101 and 102) are biased to zero volts, while the gate electrode (i.e., conductor column 109) is brought to a voltage between 10-20 volts. In this configuration, electrons in the channel region (i.e., strip 104b) are injected through tunnel oxide layer 106 into charge-trapping layer 107. During an erase operation, as illustrated by FIG. 1(c), the common source and drain electrodes are biased to 10-20 volts, while a voltage of 0 volts is applied to the gate electrode. In this configuration, the trapped electrons are extracted from nitride trapping layer 107 through tunnel oxide layer 106 into the channel region. (Holes in the channel region are injected through tunnel oxide layer 106 into nitride trapping layer 107 to neutralize the stored electrons). As the programming and erase operations create stress in tunnel oxide layer 106, tunnel oxide layer 106 may degrade with the number of programming and erase cycles.

Programming and erase operations in a memory array are typically performed in parallel (i.e., at the same time) for many memory cells. Because there are inevitably small variations in the values of geometrical and electrical parameters among the memory cells (e.g., due to local variations in the process), distributions in the natural cell threshold voltage values and threshold voltage values in the memory cells result after repeated programming and erase operations. The distributions may be narrowed (e.g., through programming and erasing algorithms) generally to any extent desired through suitable control, at the expense of programming, erase time or both.

FIG. 2(a) shows a cross section through memory cell 201 in active strip 200, in accordance with one embodiment of the present invention. To simplify description herein, like elements in FIGS. 1(a) and 2(a) are assigned like reference numerals. As shown in FIG. 2(a), rather than providing tunnel oxide layer 106 between channel region or strip 104b and nitride trapping layer 107, blocking layer 208 is provided. In place of blocking layer 108, tunnel oxide layer 206 is provided between nitride trapping layer 107 and the gate electrode (i.e., conductor column 209). Conductor column 209 may be formed out of polysilicon that may be doped either $N^+$ or $P^+$. Unlike the memory cell of FIG. 1(a), memory cell 201 of FIG. 2(a) is programmed and erased through injection or extraction of electrons and holes between the gate electrode (i.e., conductor column 209) and nitride trapping layer 107. Memory cell 201 is therefore a "reverse memory cell," as compared to the memory cell of FIG. 1(a). In the reverse memory cell configuration, blocking oxide 297 may be a silicon oxide (e.g., $SiO_2$) layer of 6-10 nm thick, nitride trapping layer 107 may be a silicon nitride (e.g., $Si_3N_4$) layer of 4-10 nm thick, tunnel oxide layer 206 may be either a silicon oxide (e.g., $SiO_2$) or a oxide-nitride-oxide ("ONO"; e.g., $SiO_2/Si_3N_4/SiO_2$) stack, with each layer being 1.2-3.0 nm thick.

FIGS. 2(b) and 2(c) show the voltage biases on the common source, the common drain and the gate electrodes of reverse memory cell 201 of FIG. 2(a) during programming and erase operations, respectively.

As shown in FIG. 2(b), during programming, the gate electrode (e.g., conductor column 209) of each reverse memory cell to be programmed is first biased to 0 volts. Thereafter, the common source and the common drain electrodes of the reverse memory cell (i.e., first and second semiconductor layers 101 and 102) receive a voltage pulse of 10-20 volts for a duration of typically 10-100 microseconds. A verify operation may then be performed to ascertain that the reverse memory cell is programmed to the desired threshold voltage. The programming and verify sequence of operations may be repeated until the reverse memory cell reaches the desired threshold voltage. In this configuration, electrons in gate electrode (i.e., conductor column 209) are injected through tunnel oxide layer 206 into charge-trapping layer 107.

Another approach for programming a reverse memory cell is to apply a succession of shorter duration stepped voltage pulses to the common source and the common drain electrodes, while the gate electrode is held at 0 volts. The stepped voltage pulses may start at around 10 volts and increases in multiple voltage increments to as high as 20 volts. After each programming pulse, a program-verify operation is performed to determine the cell threshold voltage. If the target cell threshold voltage has not been reached, a next programming pulse, incremented from the last programming pulse typically by a few hundred millivolts, is applied across the common source and the common drain electrodes. This programming and program-verify operation sequence is continued until the reverse memory cell reaches the target cell threshold voltage.

As discussed above, programming of many memory cells may be performed in parallel. Thus, a memory cell which is not intended to be programmed, or which has reached its desired or target cell threshold voltage, must be prevented from programming or further programming by a program-inhibit operation. To inhibit programming of the reverse memory cell, the gate electrode is biased to a predetermined voltage, such that the voltage difference between the gate electrode and either of the common source and the common drain electrodes is not enough to unintentionally effectuate programming. This predetermined voltage may be, for example, half the programming voltage (e.g., 5-10 volts).

During an erase operation, as shown in FIG. 2(c), the common source and the common drain electrodes are biased to 0 volts, while a voltage pulse of 10-20 volts is applied for 10-100 microseconds to the gate electrode of each reverse memory cell to be erased. In this configuration, the trapped electrons are extracted from nitride trapping layer 107 through tunnel oxide layer 106 into the gate electrode. Also, holes in the gate electrode could be injected through tunnel oxide layer 106 into nitride trapping layer 107 to neutralize the trapped electrons. Successful erasure in each reverse memory cell may be ascertained by a verify operation. If the reverse memory cell is not fully erased (i.e., the target erased threshold voltage has not been reached), the erase operation may be repeated.

To prevent erasing a reverse memory cell or to prevent a satisfactorily erased reverse memory cell from being subject to a further erase operation, inhibit voltages need to be applied. Erase inhibition may be achieved by biasing the common source and the common drain electrodes to a voltage such that, when the erase pulse is applied to the gate electrode, the voltage difference between the gate electrode and either one of the common source and the common drain electrodes is less than the voltage sufficient to achieve erasing (e.g., half the erase voltage, or 5-10 volts). In this configuration all reverse memory cells in an active strip sharing the common source electrode or common drain electrode would be prevented from successfully erased.

Another approach for erasing is to apply a succession of shorter duration, stepped voltage pulses to the gate electrode, while keeping the common source and the common drain electrodes at 0 volts. The stepped voltage pulses may start at around 10 volts and may go as high as 20 volts. After each erase pulse, an erase-verify operation is performed to determine the cell threshold voltage. If the target cell threshold voltage has not been reached, a next erase pulse, incremented from the last erase pulse typically by a few hundred millivolts, is applied to the gate electrode. This erase and erase-verify operation sequence is continued until the reverse memory cell reaches the target cell threshold voltage.

Yet another approach for erasing is to apply a single long erase pulse on the gate electrode (i.e., greater than 20 microseconds) on each reverse memory cell to be erased. Thereafter, a soft programming operation may be performed on each reverse memory cell with a threshold voltage that is lower that the erase target cell threshold voltage. In this manner, each reverse memory cell may be erased to achieve the desired erase cell threshold value.

The memory cell of FIG. 1(a) and the reverse memory cell of FIG. 2(a) both may be read in the manner as taught in the Non-provisional Patent Application.

As the injection and extraction of electrons and holes during the program and erase operations in the reverse memory cell of FIG. 2(a) take place between the gate electrode (i.e., conductor column 209) and nitride trapping layer 107 through tunnel oxide 206, blocking oxide layer 208 at the surface of channel region 204b is not used as a tunneling oxide layer. Consequently, blocking oxide layer 208 does not experience degradation due to programming or erase operations, thereby avoiding the limitations from repeated programming and erase endurance cycling. Therefore, the reverse memory cell of FIG. 2(a) (i.e., reverse memory cell 201) provides a higher endurance, as compared to the memory cell of FIG. 1(a).

The thicknesses of tunnel oxide 206 and nitride trapping layer 107 of a reverse memory cell may be optimized for certain applications. For example, the thicknesses of these layers may be set to achieve both read disturb and to carry out reliable low-voltage programming operations (e.g., voltages below 10 volts). As another example, tunnel oxide layer 206 may be made sufficiently thin to allow direct tunneling, rather than Fowler-Nordheim tunneling, at the desired programming or erase voltage (e.g., less than 10 nm). In certain applications, e.g., quasi-volatile memory (QVM) applications, greater tolerance may be traded off for a lesser retention time (e.g., minutes, rather than days or years, to allow endurance of tens of thousands of cycles or more). In those applications, nitride trapping layer 107 may be made thinner to optimize for the desired endurance and retention time.

The memory cell of the present invention may be implemented, for example, as a memory cell in the structure shown in FIG. 3, which is reproduced from FIG. 2i-1 of the Non-provisional Patent Application, incorporated by reference above.

FIG. 3 shows a three-dimensional view of horizontal active layers 202-4 to 202-7, with local word lines 208W-s or local pre-charge word lines 208-CHG connected to global word lines 208 g-s and local word lines 208W-a connected to global word lines 208 g-a, and showing each active layer as having its N$^+$ layer 223 (acting as a drain region) connected through select circuits to any of voltage supplies (e.g., $V_{ss}$, $V_{bl}$, $V_{pgm}$, $V_{inhibit}$, and $V_{erase}$), decoding, sensing and other circuits arranged either adjacent or directly underneath the memory arrays. The substrate circuitry is represented schematically by 206-0 and 206-1 in substrate 201.

Each active strip is shown in FIG. 3 with its N$^+$ sublayer 223 connected to substrate contacts 206-0 and 206-1 ($V_{bl}$), and P-sublayer 222 (channel region) connected to substrate back-bias voltage ($V_{bb}$) source 290 through circuitry 262-0. N$^+$ sublayer 221 and optional low resistivity metallic sublayer 224 may be hard-wired (see, e.g., ground reference connections 280 in FIG. 3a of Non-provisional Patent Application) to a $V_{ss}$ voltage supply, or alternatively, it may be left floating, after being pre-charged momentarily to virtual source voltage $V_{ss}$ through local pre-charge word line 208-CHG. Global word lines 208 a-a at the top of the memory array and global word lines 208 g-s at the bottom of the memory array may make contact with vertical local word lines 208W-a and 208W-s and pre-charge word lines 208-CHG. Charge-trapping layers 231L and 231R are formed between the vertical local word lines and the horizontal active strips, thus forming non-volatile memory TFTs at the intersection of each horizontal active strip and each vertical word line, on both sides of each active strip. Not shown are isolation layers between active strips on different planes and between adjacent active strips within the same plane.

N$^+$ sublayer 221 is either hard-wire connected to a ground voltage (not shown), or is not directly connected to an outside terminal and left floating, or pre-charged to a voltage (e.g., a ground voltage) during a read operation. Pre-charging may be achieved by activating local pre-charge word lines 208-CHG. P$^-$ sublayer 222 of each active layer (providing the channel regions of Ms) is optionally selectively connected through pillars 290 (described below) to supply voltage $V_{bb}$ in substrate 201, Metallic sublayer 224 is an optional low resistivity conductor, provided to reduce the resistivity of active layers 202-4 to 202-7. To simplify, interlayer isolation layers 203-0 and 203-1 of FIG. 2c of the Non-provisional Patent Application are not shown.

Global word lines 208 a-a on top of the memory array are formed by depositing, patterning and etching a metal layer following the formation of contacts or vias. Such a metal layer may be provided by, first, forming a thin tungsten nitride (TiN) layer, followed by forming a low resistance metal layer (e.g., metallic tungsten). The metal layer is then photo-lithographically patterned and etched to form the top global word lines. (Alternatively, these global word lines may be provided by a copper damascene process.) In one implementation, these global word lines are horizontal, running along the X-direction and electrically connecting the contacts formed in the isolation oxide (i.e., thereby contacting local word lines 208W-a or 208W-CHG) and with the contacts to semiconductor substrate 201 (not shown). Other mask and etch process flows known to those of ordinary skill in the art are possible to form even and odd addressed local word lines and connect them appropriately to their global word lines, either from the top of the memory array through the top global word lines or from the bottom of the memory array through the bottom global word lines (and, in some embodiments, from both top and bottom global word lines).

The above detailed description is provided to illustrate specific embodiments of the present invention and is not intended to be limiting. Numerous variations and modifications within the scope of the present invention are possible. The present invention is set forth in the accompanying claims.

We claim:

1. A thin-film memory cell, comprising:
   first and second deposited semiconductor layers of a first conductivity type;
   a third deposited semiconductor layer of a second conductivity type provided in contact with and between the first and second deposited semiconductor layers;
   a blocking dielectric layer adjacent the third deposited semiconductor layer;
   a charge-trapping layer adjacent the blocking dielectric layer, the blocking dielectric layer separating the charge-trapping layer from the third deposited semiconductor layer;
   a tunnel dielectric layer adjacent the charge-trapping layer and spaced apart from the blocking dielectric layer by the charge-trapping layer; and
   a conductive layer adjacent the tunnel dielectric layer and spaced apart from the charge-trapping layer by the tunnel dielectric layer.

2. The thin-film memory cell of claim 1, wherein the conductive layer comprises P$^+$-type or N$^+$-type polysilicon.

3. The thin-film memory cell of claim 1, wherein the first and second deposited semiconductor layers each comprise P$^+$-type polysilicon and wherein the third deposited semiconductor layer comprises N$^-$-type polysilicon.

4. The thin-film memory cell of claim 1, wherein the first and second deposited semiconductor layers each comprise N$^+$-type polysilicon and wherein the third deposited semiconductor layer comprises P$^-$-type polysilicon.

5. The thin-film memory cell of claim 1, wherein the charge-trapping layer comprises silicon nitride.

6. The thin-film memory cell of claim 1, wherein the blocking and tunnel dielectric layers each comprise silicon oxide.

7. The thin-film memory as of claim 1, wherein the tunnel dielectric layer is a composite layer made of silicon oxide/silicon nitride/silicon oxide with a thickness ranging typically between 1.2 nm and 3 nm.

8. The thin-film memory cell of claim 1, wherein the first, second and third deposited semiconductor layers serve, respectively, as a source electrode, a drain electrode and a channel region for the thin-film memory cell.

9. The thin-film memory cell of claim 8, wherein the conductive layer serves as a gate electrode for the thin-film memory cell.

10. The thin-film memory cell of claim 9, wherein the charge-trapping layer serves as storage layer for the thin-film memory cell.

11. The thin-film memory cell of claim 10, wherein the thin-film memory cell is one of a plurality of thin-film memory cells formed in a deposited semiconductor structure extending along a direction parallel to a planar surface of a semiconductor substrate.

12. The thin-film memory cell of claim 11, wherein the deposited semiconductor structure is one of a plurality of semiconductors structures provided one on top of another and extending along a direction substantially parallel to the planar surface of the semiconductor substrate.

13. The thin-film memory cell of claim 12, wherein the conductive layer extends along the direction perpendicular to the planar surface of the semiconductor substrate, such that the conductive layer serves as a common gate electrode to a memory cell in each of the semiconductor structures.

14. The thin-film memory cell of claim 9, wherein the thin-film memory cell is programmed, erased, read, program-inhibited and erase-inhibited by applying predetermined voltages of the same polarity relative to a ground reference voltage to the source electrode, the drain electrode, and the gate electrode.

15. The thin-film memory cell of claim 1, wherein the tunnel dielectric layer has a thickness that allows direct tunneling to dominate over Fowler-Nordheim tunneling at the sufficiently large potential difference.

16. The thin-film memory cell of claim 1, wherein the charge-trapping layer has a thickness that allows a predetermined charge retention period in the order of minutes.

17. The thin-film memory cell of claim 1, wherein the charge-trapping layer has a thickness that allows endurance exceeding 10,000 cycles.

18. The thin-film memory cell of claim 1, wherein the blocking and tunnel dielectric layers have a difference in layer thickness such that, when a sufficiently large potential difference is imposed across the conductive layer and the third deposited semiconductor layer, electric charge is exchanged between the conductive layer and the charge-trapping layer by tunneling through the tunnel dielectric layer.

* * * * *